US006438023B1

(12) United States Patent
Johnson

(10) Patent No.: US 6,438,023 B1
(45) Date of Patent: Aug. 20, 2002

(54) DOUBLE-EDGED CLOCKED STORAGE DEVICE AND METHOD

(75) Inventor: Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,622

(22) Filed: Aug. 31, 2000

(51) Int. Cl.$^7$ .............................................. G11C 11/00
(52) U.S. Cl. ................... 365/154; 365/233; 365/189.05
(58) Field of Search ............................... 365/154, 233, 365/189.05

(56) References Cited

U.S. PATENT DOCUMENTS

| | | | |
|---|---|---|---|
| 5,250,858 A | * 10/1993 | Strong | 326/46 |
| 5,327,019 A | 7/1994 | Kluck | 307/272.1 |
| 5,751,174 A | 5/1998 | Kuo et al. | 327/199 |
| 5,844,844 A | * 12/1998 | Bauer et al. | 365/189.05 |
| 6,044,032 A | 3/2000 | Li | 365/230.03 |
| 6,081,477 A | 6/2000 | Li | 365/233 |
| 6,154,418 A | 11/2000 | Li | 365/233 |
| 6,172,893 B1 | 1/2001 | Ryan | 365/49 |
| 6,233,199 B1 | 5/2001 | Ryan | 365/233 |
| 6,288,932 B1 | * 9/2001 | Samala | 365/154 |

OTHER PUBLICATIONS

Afghahi, M., "A Scalable Synchronous System", *IEEE*, pp. 471–474, (1988).
Afghahi, M., et al., "A Unified Single–Phase Clocking Scheme for VLSI Systems", *IEEE Journal of Solid–State Circuits*, 25(*1*), pp. 225–233, (Feb. 1990).
Afghahi, M., et al., "Double Edge–Triggered D–Flip–Flops for High Speed CMOS Circuits", *IEEE Journal of Solid–State Circuits*, 26 (*8*), pp. 1168–1170, (1991).
Gago, A., et al., "Reduced Implementation 9 D–Type DET Flip–Flops", *IEEE Journal of Solid–State Circuits*, vol. 28, No. 3, 400–402, (Mar., 1993).
Hossain, R., et al., "Low Power Design Using Double Edge Triggered Flip–Flops", *IEEE Transactions on Very Large Scale Integration (VLSI) Systems*, vol. 2, No. 2, 261–265, (Jun., 1994).
Ko, U., et al., "High–Performance Energy–Efficient D–Flip–Flop Circuits", *IEEE Transactions on Very large scale Integration (VLSI) Systems*, 8(*1*), 94–107, (2000).
Lu, S., et al., "Novel CMOS Implementation of Double–Edge–Triggered Flip–Flops", *IEEE Journal of Solid–State Circuits*, 25(*4*), pp. 1008–1010, (1990).
Unger, S., "Double–Edge–Triggered Flip–Flops", *IEEE Transactions on Computers*, C–30 (*6*), pp. 447–451, (1981).
Unger, S., et al., "Clocking Schemes for High–Speed Digital Systems", *IEEE Transactions on Computers*, C–35 (*10*), pp. 880–895, (Oct. 1986).
Yuan, et al., "High–Speed CMOS Circuit Technique", *IEEE Journal of Solid–State Circuits*, 24 (*1*), pp. 62–70, (1989).

\* cited by examiner

*Primary Examiner*—Huan Hoang
(74) *Attorney, Agent, or Firm*—Schwegman, Lundberg, Woessner & Kluth, P.A.

(57) ABSTRACT

A double-edge triggered storage device is triggered by either the rising edge, the falling edge, or both edges of a clock signal, thus realizing a higher data rate. The double-edge triggered storage device incorporates cross-coupled, enabled inverters on the inputs, thereby realizing short and potentially negative setup time. Cross-coupled tri-state inverters on the outputs improve clock-to-data times. A precharge-evaluate method is used for storing and transferring data on both rising and falling edge transitions of the clock signal. Weak feedback inverters are optionally used to maintain the state of the storage device in the absence of a clock signal.

71 Claims, 6 Drawing Sheets

DOUBLE-EDGED CLOCKED STORAGE DEVICE AND METHOD

FIELD OF THE INVENTION

The present invention relates generally to electronic circuitry, and more particularly to storage devices.

BACKGROUND OF THE INVENTION

Memory circuits are vital components in computer and electronic systems that require permanent or temporary data storage. The memory circuits, such as dynamic random access memory (DRAM), are used in computer systems, such as processor systems.

In processor based systems and electronic systems, the system operates at a certain frequency. Ideally, memory devices would operate at the same speed as the system. However, memory devices do not generally operate at the same speed as the system. This is due to the high cost involved in manufacturing and operating memory devices that can operate at very high frequencies. Memory devices generally operate at a fraction of the speed of the processor and cause the system to run more slowly.

Memory devices have been unable to operate at the speed of microprocessors because of how they operate. Memory devices have to be very compact to hold and access the large amounts of data they are required to hold. For these devices to operate faster, a significant cost must be incurred to design and produce these devices. Generally, the cost prohibits the inclusion of faster memory devices in these systems.

In these computer and electronic systems, operational speeds of dynamic random access memories used as main memories have been increased, but are still low compared with operation speeds of microprocessors. This relatively low speed increases wait time of the microprocessor and impedes fast processing, as access time and cycle time of the DRAM form a bottleneck in the performance of the whole system.

One way in which memory circuits can be made to write and read data faster is to build the memory circuits so they operate at a higher clock frequency. This has been done in microprocessors, as can be seen by the increase in operating frequency in microprocessors. For example, a microprocessor running at 200 MHZ is generally much faster than one running at 50 MHZ. However, by operating circuits at higher operating frequencies, additional problems are encountered. For example, the amount of heat produced and power used by a circuit operating at a higher frequency can be greatly increased. This corresponds to high cost solutions to handle the heat and power problems. Furthermore, the increased use of portable devices, such as laptop computers, requires that power use by circuits be reduced. Also, the higher operating frequency can cause the integrated circuit die to be more expensive.

Because memory devices are used in many different systems, increasing the speed of memory devices without significantly increasing the cost of memory devices can allow everything from word processors to automatic teller machines to perform tasks more quickly. One way to increase the speed of memory devices is to use both rising and falling edges of a clock signal to trigger data transfers. Typical edge-triggered flip-flops have one clock input that is sensitive to either rising or falling transitions of a clock signal only, depending on the configuration of the particular flip-flop as set by the manufacturer. By using both rising and falling edges, data transfer speeds can be significantly improved, e.g., doubled.

Double-edge triggered designs, however, generally suffer from a number of limitations. For example, the number of transistors involved in implementing each flip-flop is increased substantially. In addition, some double-edge triggered flip-flops suffer from metastability problems and slow response time. Further, double-edge triggered flip-flops may malfunction when the output is applied to precharge dynamic circuits.

FIG. 1 depicts a conventional double-edge triggered D-type flip-flop 100, more fully described in A. Gago et al., "Reduced Implementation of D-Type DET Flip-Flops," *IEEE Journal of Solid-State Circuits*, Vol. 28, No. 3, March 1993, pp. 400–402. In the arrangement depicted in FIG. 1, cross-coupled inverters are used to implement the double-edge triggered flip-flop 100. In these inverters, a clock signal CLK and an inverted clock signal CLK' drive center transistors 102, while outer transistors 104 are driven by a data signal D. As a result, to generate the output Q, current must be pulled through an outer transistor 104, a center transistor 102, and an output stage 106. This results in unnecessary delays in obtaining the output.

For the reasons stated above, and for other reasons stated below that will become apparent to those skilled in the art upon reading and understanding the present specification, a need continues to exist for storage devices to which data can be transferred at faster rates.

SUMMARY OF THE INVENTION

The above-mentioned and other deficiencies are addressed in the following detailed description. According to one embodiment of the present invention, a double-edge triggered storage device includes an enabled module having center transistors coupled to receive a data input signal. An output module has center transistors that are coupled to receive a normal or inverted clock signal and outer transistors that are coupled to outputs of the enabled module.

Another embodiment is directed to a double-edge triggered storage device that includes cross-coupled enabled inverters and cross-coupled tri-state inverters. Each enabled inverter is formed by center transistors and outer transistors. The center transistors are coupled to receive a data input signal. They generate output signals in response to the data input signal. The outer transistors are coupled to the normal and inverted clock signals. Each tri-state inverter is formed by center transistors and outer transistors. The center transistors receive the output of the enabled inverters. The outer transistors receive the normal and inverted clock signals.

In yet another embodiment, the double-edge triggered storage device also includes a set transistor arrangement that forces the output to a set state, independently of the clock signal, when a set input signal is asserted. Similarly, a reset transistor arrangement forces the output to a reset state, independently of the clock signal, when a reset input signal is asserted. Weak feedback inverters are coupled to outputs of the enabled inverters to maintain the storage device in a logic state in the absence of the clock signal.

Still other implementations include registers, static random access memory (SRAM) devices, integrated circuit (IC) packages, and information-handling systems incorporating such double-edge triggered storage devices. Other advantages of the present invention will be apparent to one skilled in the art upon examining the detailed description and the accompanying drawings.

DETAILED DESCRIPTION

Figure 1:
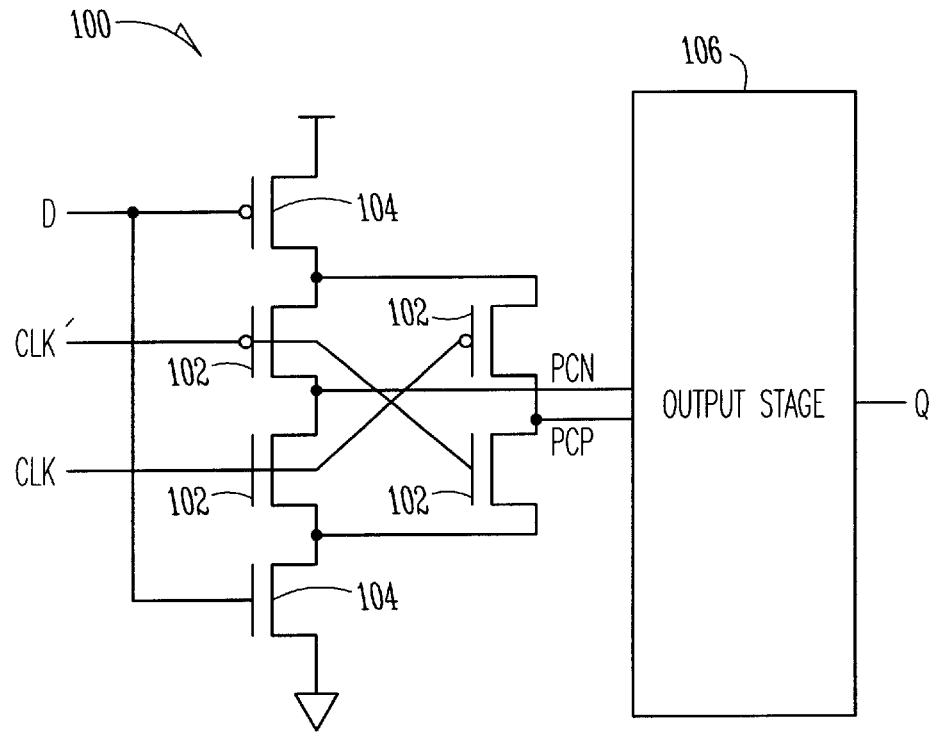
FIG. 1 is a schematic diagram of a conventional double-edge triggered flip-flop.

In the following detailed description of the invention, reference is made to the accompanying drawings, which form a part hereof, and in which is shown, by way of illustration, specific embodiments in which the invention may be practiced. In like drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereon. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The term conductor is understood to include semiconductors, and the term insulator is defined to include any material that is less electrically conductive than the materials generally referred to as conductors by those skilled in the art.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side" (as in "sidewall"), "higher," "lower," "over," and "under" are defined with respect to the conventional plane or surface being on the top surface of the wafer or substrate, regardless of the orientation of the wafer or substrate.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped—and p-type semiconductor materials, respectively. The following detailed description is, therefore, not to be taken in a limiting sense, and the scope of the present invention is defined only by the appended claims.

A digital signal of 1 may also be called a high signal and a digital signal of 0 may also be called a low signal. A rising edge or rising transition occurs when a digital signal transitions from a low state to a high state. A falling edge or falling transition occurs when a digital signal transitions from a high state to a low state.

In one particular implementation of the present invention, a storage device is configured to be triggered on either the rising edge transition or the falling edge transition of a clock signal, and is thus known as a double edge-triggered, or double-edged, storage device. Double-edged storage devices of this implementation incorporate cross-coupled, enabled inverters on the inputs for short and possibly negative setup times. Cross-coupled tri-state inverters on the outputs improve clock-to-data times. The storage device uses a precharge-evaluate method for storing and transferring data on both rising and falling edge transitions of the clock signal. By using both edge transitions, the data rate is effectively doubled, improving the usefulness of the storage device particularly in devices in which a fast data rate is desirable, such as state counters. In certain embodiments, weak feedback inverters are optionally used on the precharged nodes to hold data beyond the precharge decay time.

According to various embodiments, the storage device of the present invention can be implemented in several forms analogous to conventional types of storage devices. For example, the storage device can be implemented as a T-type flip-flop, a D-type flip-flop, a JK-type flip-flop, or an enabled flip-flop, all consistent with the present invention. In addition, the storage device can be implemented as an asynchronous set and reset device to determine the output state regardless of the state of the clock signal.

By placing input transistors on the precharged nodes, setup time is reduced because the clocking transistors are already turned on for the evaluating side of the input structure. A faster response is thus realized because charge is supplied directly from the center transistors, thereby reducing the charge redistribution through the input structure. In the output structure, clock-to-data time is improved because the clocking signal provides the inputs to the center transistors.

Figure 2:
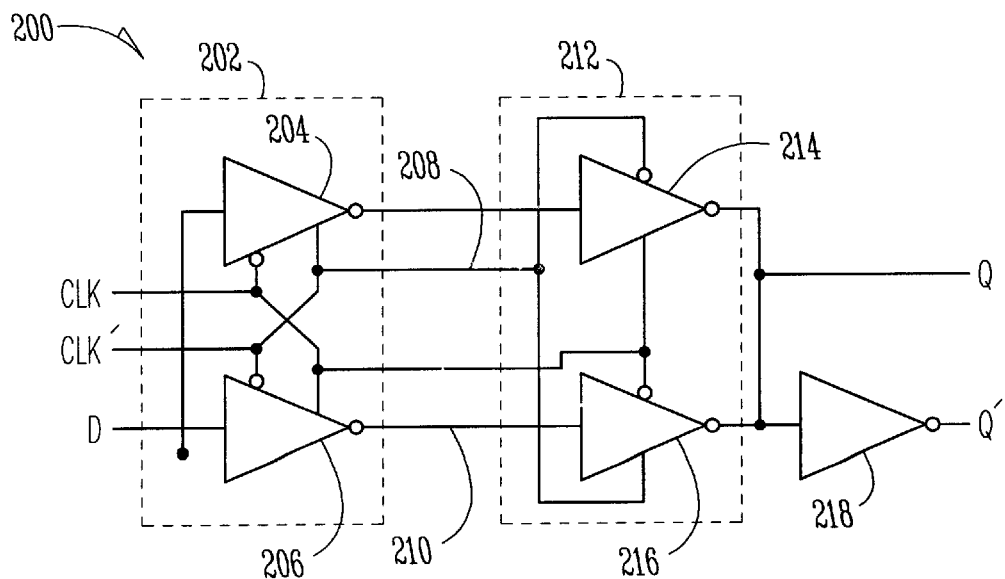
FIG. 2 is a logic diagram illustrating an example double-edge triggered storage device according to a particular embodiment of the present invention.

FIG. 2 is a logic diagram illustrating an example implementation of a double edge-triggered storage device 200, according to one embodiment of the present invention. An enabled stage 202 is formed by a pair of cross-coupled inverters 204 and 206. As depicted in FIG. 2, a data signal D is provided to the center transistors of the inverters 204 and 206. The outer transistors of the inverters 204 and 206 receive normal and inverted clock signals CLK and CLK'. This arrangement realizes the advantage of having to pull current through fewer transistors to produce the output of the enabled stage 202. As discussed more fully below in connection with FIG. 3, charge redistribution throughout the enabled stage 202 is advantageously reduced. The output of the enabled stage 202 is placed on precharged nodes 208 and 210 and are used as inputs to an output stage 212. The output stage 212 is formed by a pair of inverters 214 and 216, arranged such that the precharged nodes 208 and 210 serve as inputs to the outer transistors of the inverters 214 and 216. The normal and inverted clock signals CLK and CLK' are provided to the center transistors of the inverters 214 and 216. As will be described more fully below in connection with FIG. 3, this arrangement results in faster clock-to-data time. The output stage 212 generates a normal output signal Q. An inverter 218 produces an inverted output signal Q'.

Figure 3:
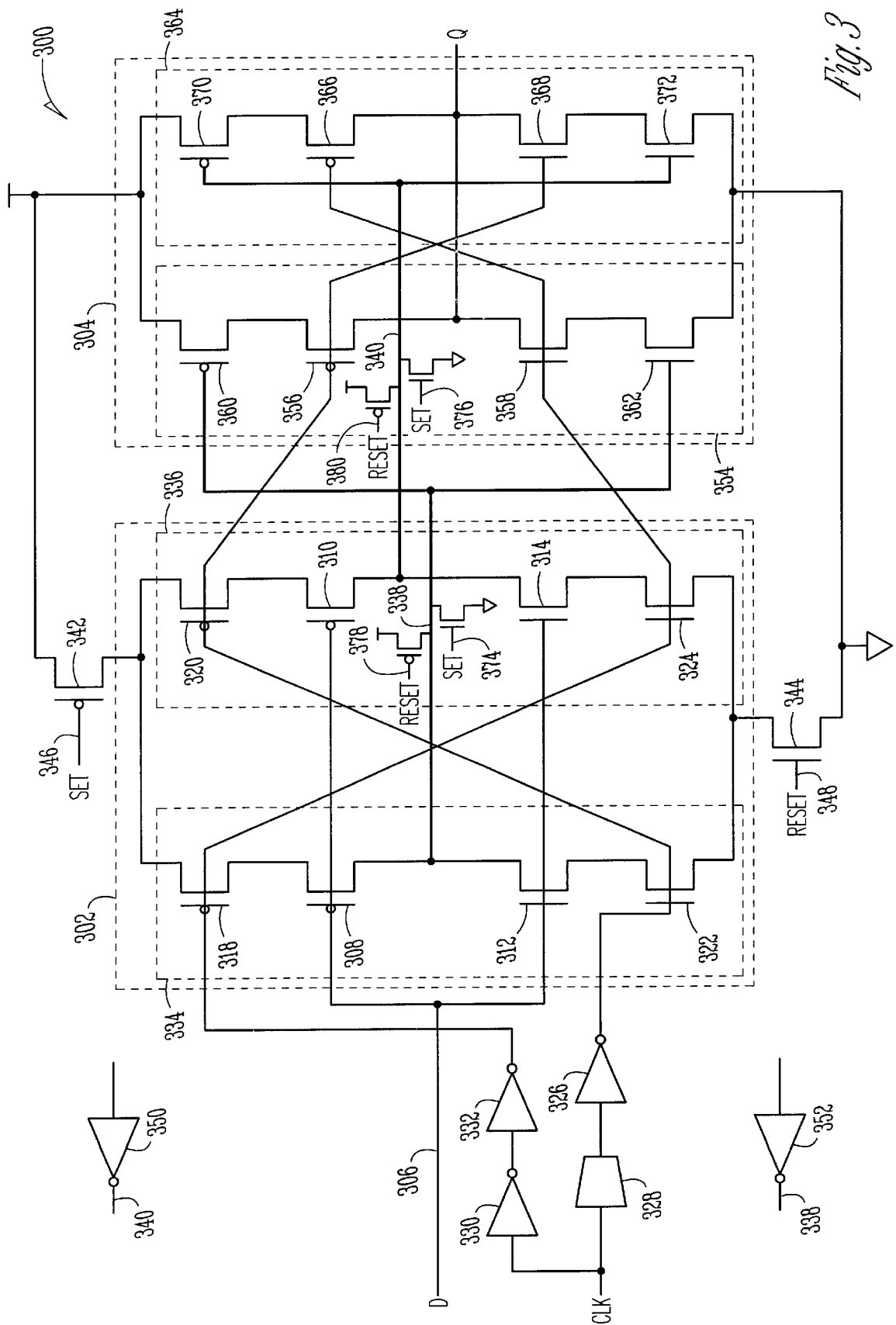
FIG. 3 is a schematic diagram illustrating an example double-edge triggered storage device according to another embodiment of the present invention.

FIG. 3 depicts an example circuit arrangement for implementing a double-egde triggered storage device 300, according to another embodiment of the present invention. The storage device 300 includes an enabled stage 302 and an output stage 304. In the enabled stage 302, a data input 306 is provided to center transistors 308, 310, 312, and 314. Center transistors 308, 310, 312, and 314 receive the data input signal D. A clock input 316 is provided to outer transistors 318, 320, 322, and 324; outer transistors 318 and 324 receive a normal clock signal CLK, while outer transistors 322 and 320 receive an inverted clock signal CLK'. In one embodiment, the clock signal is provided as a single-ended clock. As an alternative, a differential-ended clock may be used. This alternative involves routing one or more additional clock signals through the chip, but reduces noise.

In the example circuit arrangement of FIG. 3, the inverted clock signal CLK' is internally generated by an inverter 326 and a delay gate 328. The inverter 326 and delay gate 328, along with inverters 330 and 332 coupled to the clock input 316, serve the additional purpose of deskewing the clock signal so that the clock signal is not so skewed by the time it arrives at the outer transistors 318, 320, 322, and 324 that it activates two stages simultaneously. By increasing the amount of delay imparted by inverters 326, 330, and 332 and delay gate 328, the setup time can be made negative. With the setup time negative, the data can advantageously be changed after the clock actually transitions, allowing the clock edge to be softened and time to be borrowed from a previous clock cycle.

The center transistors 308 and 312 and the outer transistors 318 and 322 form an enabled inverter 334. Another enabled inverter 336 is formed by center transistors 310 and 314 and outer transistors 320 and 324. The enabled inverters 334 and 336 generate precharge signals on precharged nodes 338 and 340 in response to a data input signal presented to the center transistors 308, 310, 312, and 314. With the data input signal presented to these transistors rather than to the outer transistors 318, 320, 322, and 324, charge redistribution is improved. The enabled inverters 334 and 336 are cross-coupled by the clock signal, such that one enabled inverter is always evaluating the data input signal while the other one is switched off. For example, when the clock signal is high, the enabled inverter 336 evaluates the data input signal, which is tied to the precharged node 340.

Tying the data input signal to the precharged node 340 rather than the outside nodes improves charge redistribution because, when the clock signal is high, charge is brought to the sources of center transistors 310 and 314. As the data input signal switches, current is pulled from either the voltage supply or ground through center transistors 310 or 314, respectively, and placed on the precharged node 340, which drives the output stage 304.

Similarly, when the clock signal is low, the enabled inverter 334 evaluates the data input signal, which in this case is tied to the precharged node 338. When the clock signal is low, charge is brought to the sources of outer transistors 318 and 322. As the data input signal switches, current is placed on the precharged node 338, which also drives the output stage 304, through center transistors 308 or 312, respectively.

Accordingly, the precharged nodes 338 and 340 are used to drive the output stage 304. As discussed above, the precharged nodes 338 and 340 are primarily driven by the data input 306. In a particular embodiment of the present invention, the precharged nodes 338 and 340 can also be forced to the set or the reset state by a set signal applied to optional set transistors 342, 374, and 376, or an active low reset signal applied to optional reset transistors 344, 378, and 380, respectively. A particular circuit embodying the present invention can incorporate the set transistors 342, 374, and 376, the reset transistors 344, 378, and 380, both set and reset transistors, or neither. To set or reset the storage device 300, power is turned off for the enabled stage 302 for either pull-up or pull-down, and either the set transistors 374 and 376 or the reset transistors 378 and 380 are turned on. With the set transistor 342 turned off and the set transistors 374 and 376 turned on, the precharged nodes 338 and 340 are pulled down, forcing the output to the set state. Conversely, when the reset transistor 344 is turned off and the reset transistors 378 and 380 are turned on, the precharged nodes 338 and 340 are pulled up, forcing the output to the reset state. Accordingly, set input 346 and reset input 348 operate independently of the clock input 316. When either the set input 346 or the reset input 348 is asserted, the enabled stage 302 no longer evaluates the incoming data on the data input 306 because the power supply has been turned off.

Weak feedback inverters 350 and 352 are optionally used on the precharged nodes 338 and 340 to hold data beyond the precharge decay time. A constant current drain is maintained through the inverters 350 and 352, which source current back to the precharged nodes 338 and 340 to allow them to maintain the previous state in the absence of a clock signal. On the other hand, omitting the weak feedback inverters 350 and 352 allows for a faster circuit because the inverters 350 and 352 weakly source current back to the precharged nodes 338 and 340 that is opposite to the state that should be driven in some circumstances. If this state changes, the inverters 350 and 352 will weakly drive the opposite direction of current flow. As a result, the precharge time is slightly slowed by the presence of the inverters 350 and 352. This slowing effect is generally relatively insignificant, and the disadvantage associated with it is outweighed by the advantage of avoiding loss of the precharge signal in the event of loss of the clock signal.

In the output stage 304, a tri-state inverter 354 is formed by center transistors 356 and 358 and outer transistors 360 and 362. Another tri-state inverter 364 is formed by center transistors 366 and 368 and outer transistors 370 and 372. The clock signal drives the center transistors 356, 358, 366, and 368. The outer transistors 360, 362, 370, and 372 are driven by the outputs of the enabled stage 302. These outer transistors are driven before the clock signal arrives at the center transistors.

By comparison, had the outputs of the enabled stage 302 driven the center transistors 356, 358, 366, and 368 instead, then the outer transistors 360, 362, 370, and 372 would have had to be driven by the clock signal. This would require current to be pulled through two transistors to the output. By using the precharged nodes 338 and 340, the drain regions of the outer transistors are charged so that when the clock signal does arrive at the center transistors, the outer transistors are ready to switch, and current only needs to be pulled through one transistor directly to the output. For example, by the time the clock signal arrives at the center transistors 366 and 368, the drain regions of the outer transistors 370 and 372 are already precharged, and current need not be pulled through them to produce the output. Thus, when the clock signal transitions, the outer transistors switch immediately. As a result, clock-to-output time is improved, resulting in a faster output after the clock signal transitions.

When the clock signal transitions to the low state, data is driven out of the tri-state inverter 364 while the next cycle is being evaluated by the enabled inverter 334. When the clock signal transitions to the high state, the tri-state inverter 364 turns off, and the tri-state inverter 354 turns on and drives the output. Similarly, the enabled inverter 334 turns off, and the enabled inverter 336 turns on and evaluates the next cycle.

According to other embodiments of the present invention, the double-edge triggered storage device 300 depicted in FIG. 3 can be incorporated in any application environment in which conventional storage devices are typically used. For example, the double-edge triggered storage device 300 can be incorporated in a shift register, a bank register, a decoder, a random number generator, or a ring counter. These examples are provided for illustrative purposes only and are not intended as an exhaustive list.

Figure 4:
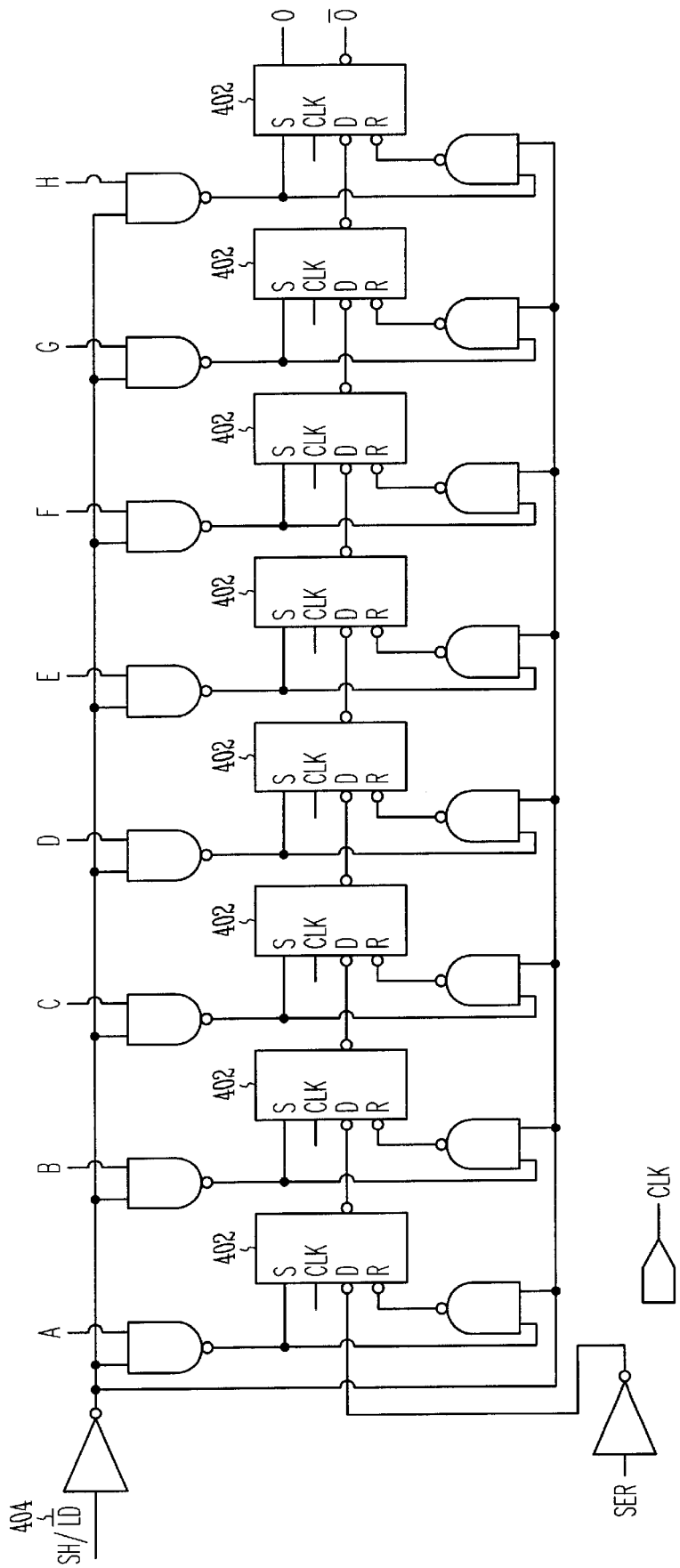
FIG. 4 illustrates an example register according to another embodiment of the present invention.

FIG. 4, for instance, illustrates an example eight-bit shift register 400, according to another embodiment of the present invention. Unlike conventional single-edge triggered shift-registers, the shift register 400 can use either or both edges of the clock signal to time loading or shifting of data. The shift register 400 includes eight double-edge triggered storage devices 402, each of which is implemented, for example, as a storage device of the type depicted in FIG. 3. It should be noted that, while FIG. 3 depicts a D flip-flop, other types of double-edge triggered storage devices, e.g., SR or JK flip-flops, can be used to implement the shift register 400. The storage devices 402 are clocked by a clock signal CLK, which is to be understood to be coupled to the clock input of each storage device 402, even though the connections are not explicitly shown in FIG. 4 due to space considerations. A shift/load control input 404 controls whether data is loaded or shifted during a given transition of the clock signal. When the shift/load control input 404 is high and the clock signal transitions, data is shifted one bit to the right, beginning with the loading of a serial data input SER into the leftmost storage device 402. On the other hand, when the shift/load control input 404 is low, data is loaded from inputs A–H at the top of FIG. 4 when the clock signal transitions.

The shift register 400 can be configured to provide its own output as input to itself using feedback arrangements. In such an arrangement, the only external signal used by the shift register 400 would be the clock signal. The feedback shift register thus formed generates an output sequence that repeats with a cycle length of no greater than $2^n$ bits, where n is the number of storage devices 402 in the shift register 400. This property can be used to implement a ring counter that generates a code sequence with $2^n$ different states.

Further, by using exclusive-OR arrangements as the only feedback arrangements, the shift register 400 can be used to implement a linear feedback shift register, according to another embodiment of the present invention. The linear feedback shift register generates a pseudorandom binary sequence of length $2^n-1$.

Figure 5:
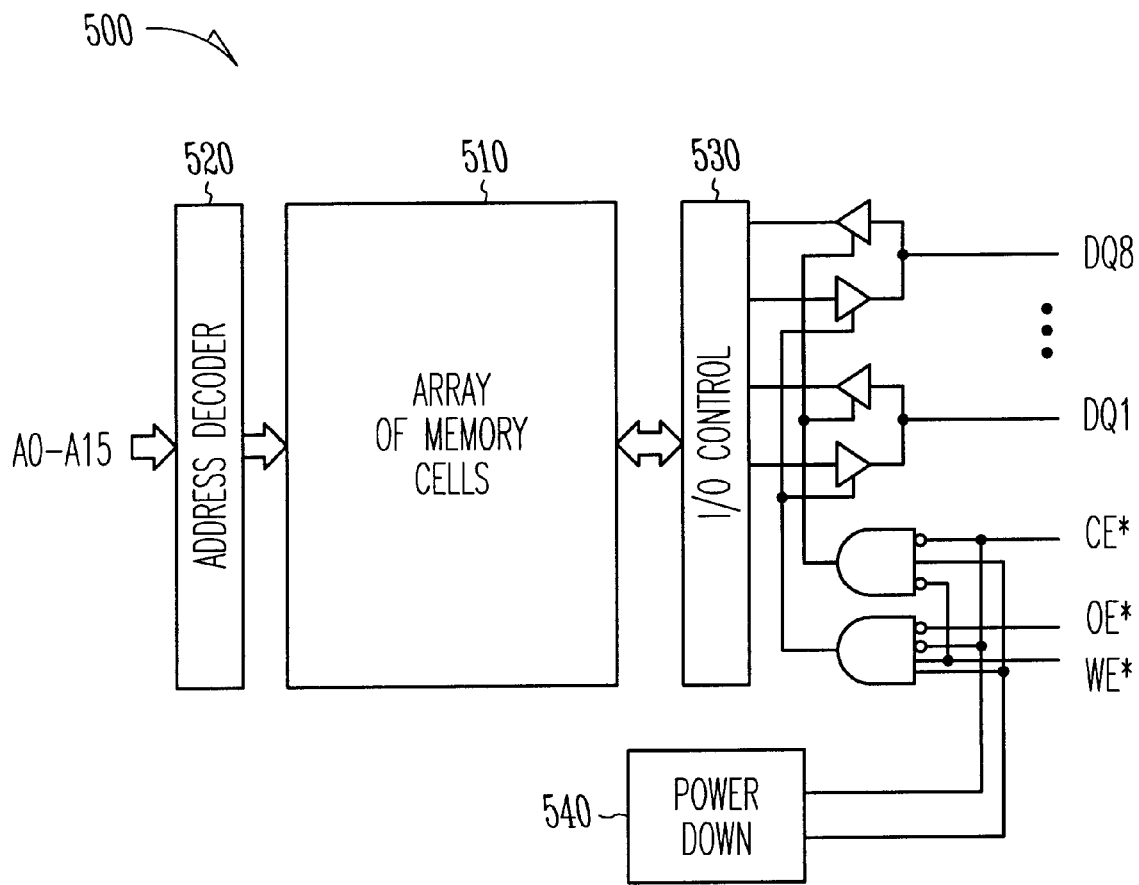
FIG. 5 depicts an example static random access memory device according to still another embodiment of the present invention.
Figure 6:
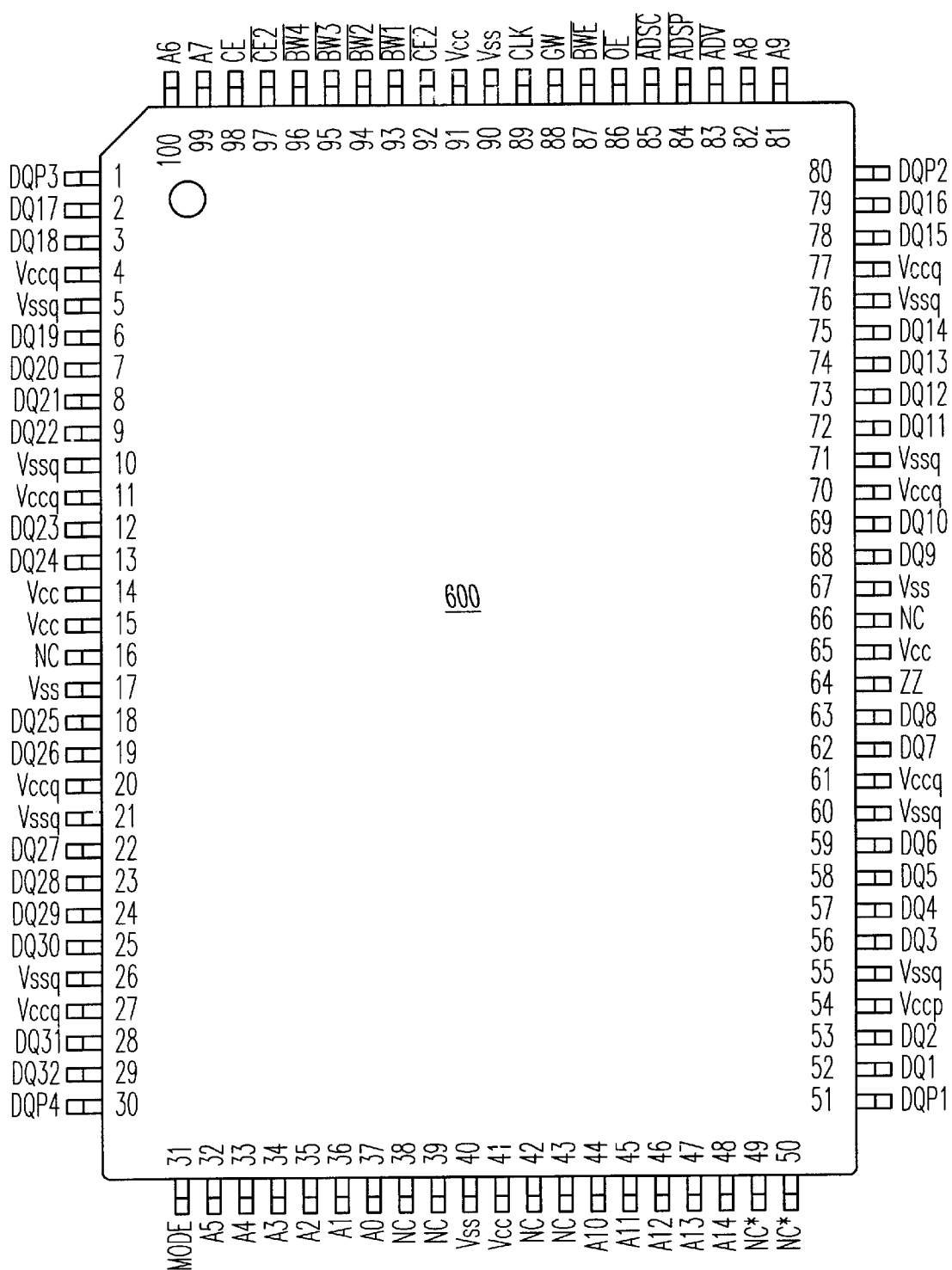
FIG. 6 is a schematic diagram of an example integrated circuit (IC) package according to yet another embodiment of the present invention.

FIG. 5 depicts an example static random access memory (SRAM) device 500 according to still another embodiment of the present invention. The SRAM 500 includes one or more storage devices described above with respect to FIGS. 2–3. The SRAM 500 has an array 510 of memory cells that are accessed according to address signals provided to the SRAM 500 at a number of address inputs A0–A15. An address decoder 520 decodes the address signals and accesses memory cells in the array 510 according to the address signals. Data is written to the memory cells in the array 510 when a write enable signal WE* and a chip enable signal CE* coupled to the SRAM 500 are both low. The data is received by the SRAM 500 over eight data input/output (I/O) paths DQ1–DQ8. The data is coupled to the memory cells in the array 510 from the I/O paths DQ1–DQ8 through an I/O control circuit 530. Data is read from the memory cells in the array 510 when the write enable signal WE* is high and an output enable signal OE* coupled to the SRAM 500 and the chip enable signal CE* are both low. A power down circuit 540 controls the SRAM 500 during a power-down mode. According to another embodiment, the SRAM 500 is housed in an integrated circuit (IC) package 600, depicted in FIG. 6. The storage devices described above in connection with FIGS. 2–3 according to embodiments of the present invention can be included in other types of memory devices, such as DRAMs, programmable logic devices, PROMs, EPROMs, and EEPROMs.

Figure 7:
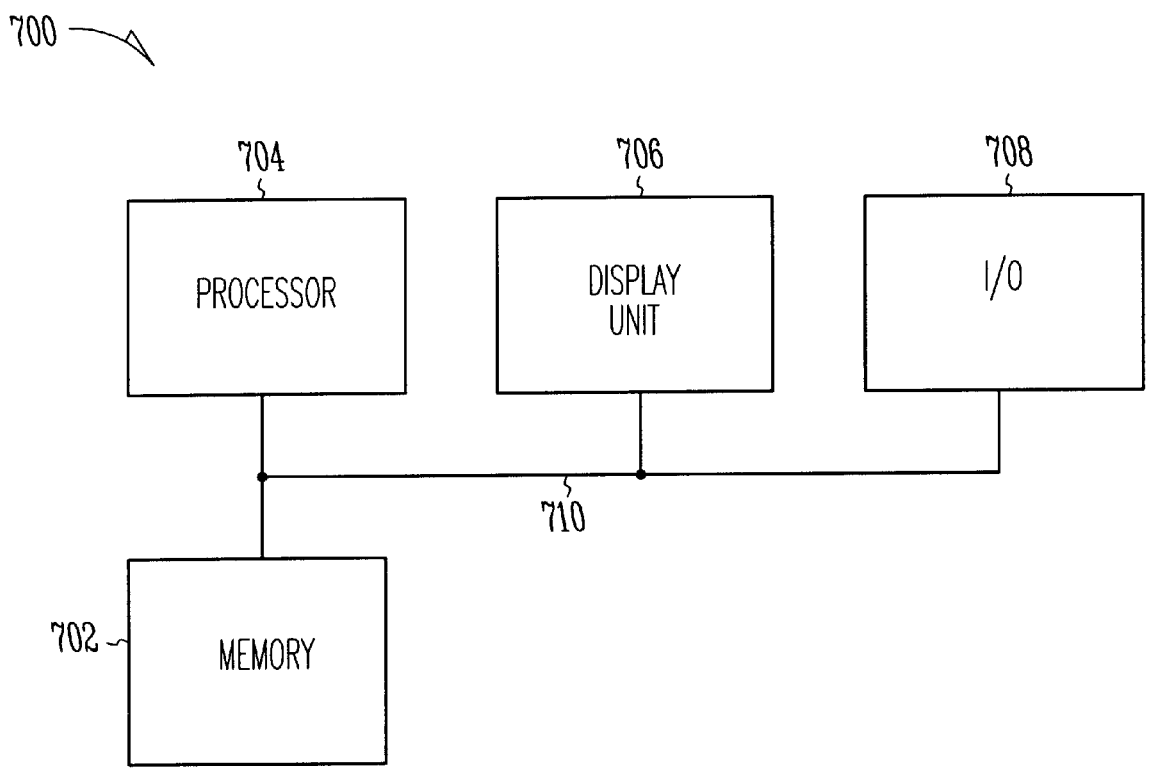
FIG. 7 is a block diagram of an example information-handling system according to another embodiment of the present invention.

FIG. 7 is a block diagram of an example information-handling system 700 according to another embodiment of the present invention. The information-handling system 700 includes a memory system 702, a processor 704, a display unit 706, and an input/output (I/O) subsystem 708. The processor 704 may be, for example, a microprocessor. One or more of the memory system 702, the processor 704, and the I/O subsystem 708 may contain a storage device as described above in connection with FIGS. 2–3. The memory system 702, the processor 704, the display unit 706, and the I/O subsystem 708 are coupled together by a suitable communication line or bus 710. The processor 704 and the memory system 702 may be integrated circuits formed on a single substrate.

In various embodiments of the present invention, the information-handling system 700 is a computer system, such as, e.g., a video game, a hand-held calculator, a television set-top box, a fixed-screen telephone, a smart mobile telephone, a personal digital assistant (PDA), a network computer (NC), a hand-held computer, a personal computer (PC), or a multi-processor supercomputer. The information-handling system 700 is alternatively an information appliance, such as a cellular telephone or any wireless device, a pager, or a daily planner or organizer. The information-handling system 700 may also be implemented as an information component, e.g., a magnetic disk drive or a telecommunications modem, or some other appliance, such as a hearing aid, a washing machine, or a microwave oven having an electronic controller.

Although specific embodiments have been illustrated and described herein, it will be appreciated by those skilled in the art having the benefit of this description that any equivalent arrangement can be substituted for the specific embodiments shown. For example, specific memory devices, e.g., D flip-flops, have been described and shown in the Figures. One skilled in the art having the benefit of this description will recognize that the invention may be employed in other types of memory devices, including but not limited to JK flip-flops and T flip-flops, and in other types of integrated circuit devices. The present invention is therefore limited only by the claims and equivalents thereof.

What is claimed is:

1. A double-edge triggered storage device comprising:
an enabled module having a plurality of center transistors coupled to receive a data input signal; and
an output module having a plurality of center transistors each coupled to receive one of a clock signal and an inverted clock signal and a plurality of outer transistors each coupled to receive a signal generated by the enabled module.

2. The double-edge triggered storage device of claim 1, wherein the clock signal is a single-ended clock signal.

3. The double-edge triggered storage device of claim 1, wherein the clock signal is a differential-ended clock signal.

4. The double-edge triggered storage device of claim 1, further comprising an inverter arrangement configured to generate the inverted clock signal.

5. The double-edge triggered storage device of claim 1, further comprising at least one inverter arrangement configured to deskew the clock signal.

6. The double-edge triggered storage device of claim 5, wherein the at least one inverter arrangement is configured to impart a sufficient delay on the clock signal to produce a negative setup time.

7. The double-edge triggered storage device of claim 1, further comprising a set transistor arrangement configured to, upon assertion of a set input signal, force an output of the storage device to a set state independently of the clock signal.

8. The double-edge triggered storage device of claim 1, further comprising a reset transistor arrangement configured to, upon assertion of a reset input signal, force an output of the storage device to a reset state independently of the clock signal.

9. The double-edge triggered storage device of claim 1, further comprising a plurality of weak feedback inverters coupled to outputs of the enabled module and configured to maintain the storage device in a logic state in the absence of the clock signal.

10. The double-edge triggered storage device of claim 1, wherein the double-edge triggered storage device is a T-type flip-flop.

11. The double-edge triggered storage device of claim 1, wherein the double-edge triggered storage device is a D-type flip-flop.

12. The double-edge triggered storage device of claim 1, wherein the double-edge triggered storage device is a JK-type flip-flop.

13. The double-edge triggered storage device of claim 1, wherein the double-edge triggered storage device is an enabled flip-flop.

14. A double-edge triggered storage device comprising:
a plurality of cross-coupled enabled inverters each comprising:
a plurality of center transistors coupled to receive a data input signal and configured to generate a plurality of output signals in response thereto, and
a plurality of outer transistors coupled to receive one of a clock signal and an inverted clock signal; and
a plurality of cross-coupled tri-state inverters, coupled to the plurality of enabled inverters, each tri-state inverter comprising:
a plurality of center transistors coupled to receive an output signal generated by the plurality of enabled inverters; and
a plurality of outer transistors coupled to receive one of the clock signal and the inverted clock signal.

15. The double-edge triggered storage device of claim 14, wherein the clock signal is a single-ended clock signal.

16. The double-edge triggered storage device of claim 14, wherein the clock signal is a differential-ended clock signal.

17. The double-edge triggered storage device of claim 14, further comprising an inverter arrangement configured to generate the inverted clock signal.

18. The double-edge triggered storage device of claim 14, further comprising at least one inverter arrangement configured to deskew the clock signal.

19. The double-edge triggered storage device of claim 18, wherein the at least one inverter arrangement is configured to impart a sufficient delay on the clock signal to produce a negative setup time.

20. The double-edge triggered storage device of claim 14, further comprising a set transistor arrangement configured to, upon assertion of a set input signal, force an output of the storage device to a set state independently of the clock signal.

21. The double-edge triggered storage device of claim 14, further comprising a reset transistor arrangement configured to, upon assertion of a reset input signal, force an output of the storage device to a reset state independently of the clock signal.

22. The double-edge triggered storage device of claim 14, further comprising a plurality of weak feedback inverters coupled to outputs of the enabled inverters and configured to maintain the storage device in a logic state in the absence of the clock signal.

23. The double-edge triggered storage device of claim 14, wherein the double-edge triggered storage device is a T-type flip-flop.

24. The double-edge triggered storage device of claim 14, wherein the double-edge triggered storage device is a D-type flip-flop.

25. The double-edge triggered storage device of claim 14, wherein the double-edge triggered storage device is a JK-type flip-flop.

26. The double-edge triggered storage device of claim 14, wherein the double-edge triggered storage device is an enabled flip-flop.

27. A double-edge triggered storage device comprising:
a plurality of cross-coupled enabled inverters each comprising:
a plurality of center transistors coupled to receive a data input signal and configured to generate a plurality of output signals in response thereto; and
a plurality of outer transistors coupled to receive one of a clock signal and an inverted clock signal;
a plurality of cross-coupled tri-state inverters, coupled to the plurality of enabled inverters, each tri-state inverter comprising:
a plurality of center transistors coupled to receive an output signal generated by the plurality of enabled inverters; and
a plurality of outer transistors coupled to receive one of the clock signal and the inverted clock signal;
a set transistor arrangement configured to, upon assertion of a set input signal, force an output of the storage device to a set state independently of the clock signal;
a reset transistor arrangement configured to, upon assertion of a reset input signal, force an output of the storage device to a reset state independently of the clock signal; and
a plurality of weak feedback inverters coupled to outputs of the enabled inverters and configured to maintain the storage device in a logic state in the absence of the clock signal.

28. A register comprising at least one double-edge triggered storage device, the at least one double-edge triggered storage device comprising:
an enabled module having a plurality of center transistors coupled to receive a data input signal; and an output module having a plurality of center transistors each coupled to receive one of a clock signal and an inverted clock signal and a plurality of outer transistors each coupled to receive a signal generated by the enabled module.

29. The register of claim 28, wherein the clock signal is a single-ended clock signal.

30. The register of claim 28, wherein the clock signal is a differential-ended clock signal.

31. The register of claim 28, wherein the at least one double-edge triggered storage device further comprises an inverter arrangement configured to generate the inverted clock signal.

32. The register of claim 28, wherein the at least one double-edge triggered storage device further comprises at least one inverter arrangement configured to deskew the clock signal.

33. The register of claim 32, wherein the at least one inverter arrangement is configured to impart a sufficient delay on the clock signal to produce a negative setup time.

34. The register of claim 28, wherein the at least one double-edge triggered storage device further comprises a set transistor arrangement configured to, upon assertion of a set input signal, force an output of the storage device to a set state independently of the clock signal.

35. The register of claim 28, wherein the at least one double-edge triggered storage device further comprises a reset transistor arrangement configured to, upon assertion of a reset input signal, force an output of the storage device to a reset state independently of the clock signal.

36. The register of claim 28, wherein the at least one double-edge triggered storage device further comprises a plurality of weak feedback inverters coupled to outputs of the enabled module and configured to maintain the storage device in a logic state in the absence of the clock signal.

37. The register of claim 28, wherein the double-edge triggered storage device is a T-type flip-flop.

38. The register of claim 28, wherein the double-edge triggered storage device is a D-type flip-flop.

39. The register of claim 28, wherein the double-edge triggered storage device is a JK-type flip-flop.

40. The register of claim 28, wherein the double-edge triggered storage device is an enabled flip-flop.

41. The register of claim 28, wherein the register is configured as a shift register.

42. The register of claim 28, wherein the register is configured as a bank register.

43. The register of claim 28, wherein the register is configured to generate a pseudorandom binary sequence.

44. The register of claim 28, wherein the register is configured as a ring counter.

45. A static random access memory (SRAM) device comprising at least one double-edge triggered storage device, the at least one double-edge triggered storage device comprising:
an enabled module having a plurality of center transistors coupled to receive a data input signal; and
an output module having a plurality of center transistors each coupled to receive one of a clock signal and an inverted clock signal and a plurality of outer transistors each coupled to receive a signal generated by the enabled module.

46. The SRAM device of claim 45, wherein the double-edge triggered storage device is a T-type flip-flop.

47. The SRAM device of claim 45, wherein the double-edge triggered storage device is a D-type flip-flop.

48. The SRAM device of claim 45, wherein the double-edge triggered storage device is a JK-type flip-flop.

49. The SRAM device of claim 45, wherein the double-edge triggered storage device is an enabled flip-flop.

50. An integrated circuit (IC) package housing a static random access memory (SRAM) device comprising at least one double-edge triggered storage device, the at least one double-edge triggered storage device comprising:
an enabled module having a plurality of center transistors coupled to receive a data input signal; and
an output module having a plurality of center transistors each coupled to receive one of a clock signal and an inverted clock signal and a plurality of outer transistors each coupled to receive a signal generated by the enabled module.

51. The IC package of claim 50, wherein the double-edge triggered storage device is a T-type flip-flop.

52. The IC package of claim 50, wherein the double-edge triggered storage device is a D-type flip-flop.

53. The IC package of claim 50, wherein the double-edge triggered storage device is a JK-type flip-flop.

54. The IC package of claim 50, wherein the double-edge triggered storage device is an enabled flip-flop.

55. An information-handling system comprising at least one double-edge triggered storage device, the at least one double-edge triggered storage device comprising:
an enabled module having a plurality of center transistors coupled to receive a data input signal; and
an output module having a plurality of center transistors each coupled to receive one of a clock signal and an inverted clock signal and a plurality of outer transistors each coupled to receive a signal generated by the enabled module.

56. The information-handling system of claim 55, wherein the clock signal is a single-ended clock signal.

57. The information-handling system of claim 55, wherein the clock signal is a differential-ended clock signal.

58. The information-handling system of claim 55, wherein the at least one double-edge triggered storage device further comprises an inverter arrangement configured to generate the inverted clock signal.

59. The information-handling system of claim 55, wherein the at least one double-edge triggered storage device further comprises at least one inverter arrangement configured to deskew the clock signal.

60. The information-handling system of claim 59, wherein the at least one inverter arrangement is configured to impart a sufficient delay on the clock signal to produce a negative setup time.

61. The information-handling system of claim 55, wherein the at least one double-edge triggered storage device further comprises a set transistor arrangement configured to, upon assertion of a set input signal, force an output of the storage device to a set state independently of the clock signal.

62. The information-handling system of claim 55, wherein the at least one double-edge triggered storage device further comprises a reset transistor arrangement configured to, upon assertion of a reset input signal, force an output of the storage device to a reset state independently of the clock signal.

63. The information-handling system of claim 55, wherein the at least one double-edge triggered storage device further comprises a plurality of weak feedback inverters coupled to outputs of the enabled module and configured to maintain the storage device in a logic state in the absence of the clock signal.

64. The information-handling system of claim 55, wherein the double-edge triggered storage device is a T-type flip-flop.

65. The information-handling system of claim 55, wherein the double-edge triggered storage device is a D-type flip-flop.

66. The information-handling system of claim 55, wherein the double-edge triggered storage device is a JK-type flip-flop.

67. The information-handling system of claim 55, wherein the double-edge triggered storage device is an enabled flip-flop.

68. The information-handling system of claim 55, wherein the information-handling system is configured as a computer system.

69. The information-handling system of claim 55, wherein the information-handling system is configured as an information appliance.

70. The information-handling system of claim 55, wherein the information-handling system is configured as an information component.

71. The information-handling system of claim 55, wherein the information-handling system is incorporated in an appliance.

* * * * *